United States Patent
Kinoshita et al.

(10) Patent No.: US 8,759,859 B2
(45) Date of Patent: Jun. 24, 2014

(54) LIGHT-EMITTING ELEMENT, SELF-SCANNING LIGHT-EMITTING ELEMENT ARRAY, OPTICAL WRITING HEAD, AND IMAGE FORMING APPARATUS

(75) Inventors: Taku Kinoshita, Kanagawa (JP); Kazutaka Takeda, Kanagawa (JP); Takashi Kondo, Kanagawa (JP); Hideo Nakayama, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/562,673

(22) Filed: Jul. 31, 2012

(65) Prior Publication Data

US 2013/0234167 A1 Sep. 12, 2013

(30) Foreign Application Priority Data

Mar. 8, 2012 (JP) .................. 2012-051120

(51) Int. Cl.
*H01L 33/00* (2010.01)
*H01L 21/00* (2006.01)
(52) U.S. Cl.
USPC ............................................. 257/98; 438/22
(58) Field of Classification Search
USPC ............... 438/22–47, 69, 493, 503, 507, 956; 257/13, 79–103, 918, 40, 642–643, 257/759

See application file for complete search history.

(56) References Cited

U.S. PATENT DOCUMENTS

| 5,451,977 | A | 9/1995 | Kusuda et al. | |
| 5,814,841 | A | 9/1998 | Kusuda et al. | |
| 2008/0279229 | A1* | 11/2008 | Suzuki et al. | 372/19 |
| 2009/0028563 | A1* | 1/2009 | Tanigawa et al. | 398/65 |
| 2010/0273278 | A1* | 10/2010 | Omori | 438/16 |
| 2011/0037093 | A1* | 2/2011 | Murata et al. | 257/99 |

FOREIGN PATENT DOCUMENTS

JP A-01-238962 9/1989

* cited by examiner

*Primary Examiner* — Julio J Maldonado
*Assistant Examiner* — Moin Rahman
(74) *Attorney, Agent, or Firm* — Oliff PLC

(57) ABSTRACT

Disclosed is a light-emitting element including a semiconductor substrate, an island structure formed on the semiconductor substrate and including at least a current confining layer and p-type and n-type semiconductor layers, a light-emitting thyristor formed in the island structure and having a pnpn structure, and a shift thyristor formed in the island structure and having a pnpn structure, wherein a groove portion having a depth such that the groove portion reaches at least the current confining layer is formed between a formation region of the shift thyristor of the island structure and a formation region of the light-emitting thyristor, and an oxidized region that is selectively oxidized from a side surface of the island structure and a side surface of the groove portion is formed in the current confining layer.

17 Claims, 14 Drawing Sheets

CROSS-SECTIONAL VIEW ALONG LINE B-B

CROSS-SECTIONAL VIEW ALONG LINE A1-A1

CROSS-SECTIONAL VIEW ALONG LINE A2-A2

CROSS-SECTIONAL VIEW ALONG LINE A3-A3

CROSS-SECTIONAL VIEW ALONG LINE B-B

CROSS-SECTIONAL VIEW ALONG LINE B-B

CROSS-SECTIONAL VIEW ALONG LINE B-B

US 8,759,859 B2

LIGHT-EMITTING ELEMENT, SELF-SCANNING LIGHT-EMITTING ELEMENT ARRAY, OPTICAL WRITING HEAD, AND IMAGE FORMING APPARATUS

CROSS-REFERENCE TO RELATED APPLICATIONS

This application is based on and claims priority under 35 USC 119 from Japanese Patent Application No. 2012-051120 filed Mar. 8, 2012.

BACKGROUND (i) Technical Field

The present invention relates to a light-emitting element, a self-scanning light-emitting element array, an optical writing head, and an image forming apparatus.

(ii) Related Art

Surface light-emitting element arrays are used in a writing head of a contact image sensor, a printer, and the like. A typical surface light-emitting element array is configured by integrating multiple light-emitting elements arranged in a linear form on one substrate. As typical examples of a surface light-emitting element, alight-emitting diode (LED), a light-emitting thyristor, and a laser diode are known. Among these examples, alight-emitting thyristor has a configuration in which compound semiconductor layers of GaAs or AlGaAs are stacked in a pnpn structure, and an electric current flows between an anode and a cathode when a driving current is applied to a gate, whereby the light-emitting thyristor emits light.

SUMMARY

According to an aspect of the present invention, there is provided a light-emitting element including: a semiconductor substrate; an island structure formed on the semiconductor substrate and including at least a current confining layer and p-type and n-type semiconductor layers; a light-emitting thyristor formed in the island structure and having a pnpn structure; and a shift thyristor formed in the island structure and having a pnpn structure, wherein a groove portion having a depth such that the groove portion reaches at least the current confining layer is formed between a formation region of the shift thyristor of the island structure and a formation region of the light-emitting thyristor, and an oxidized region that is selectively oxidized from a side surface of the island structure and a side surface of the groove portion is formed in the current confining layer.

BRIEF DESCRIPTION OF THE DRAWINGS

Exemplary embodiments of the present invention will be described in detail based on the following figures, wherein.

DETAILED DESCRIPTION

Figure 1:
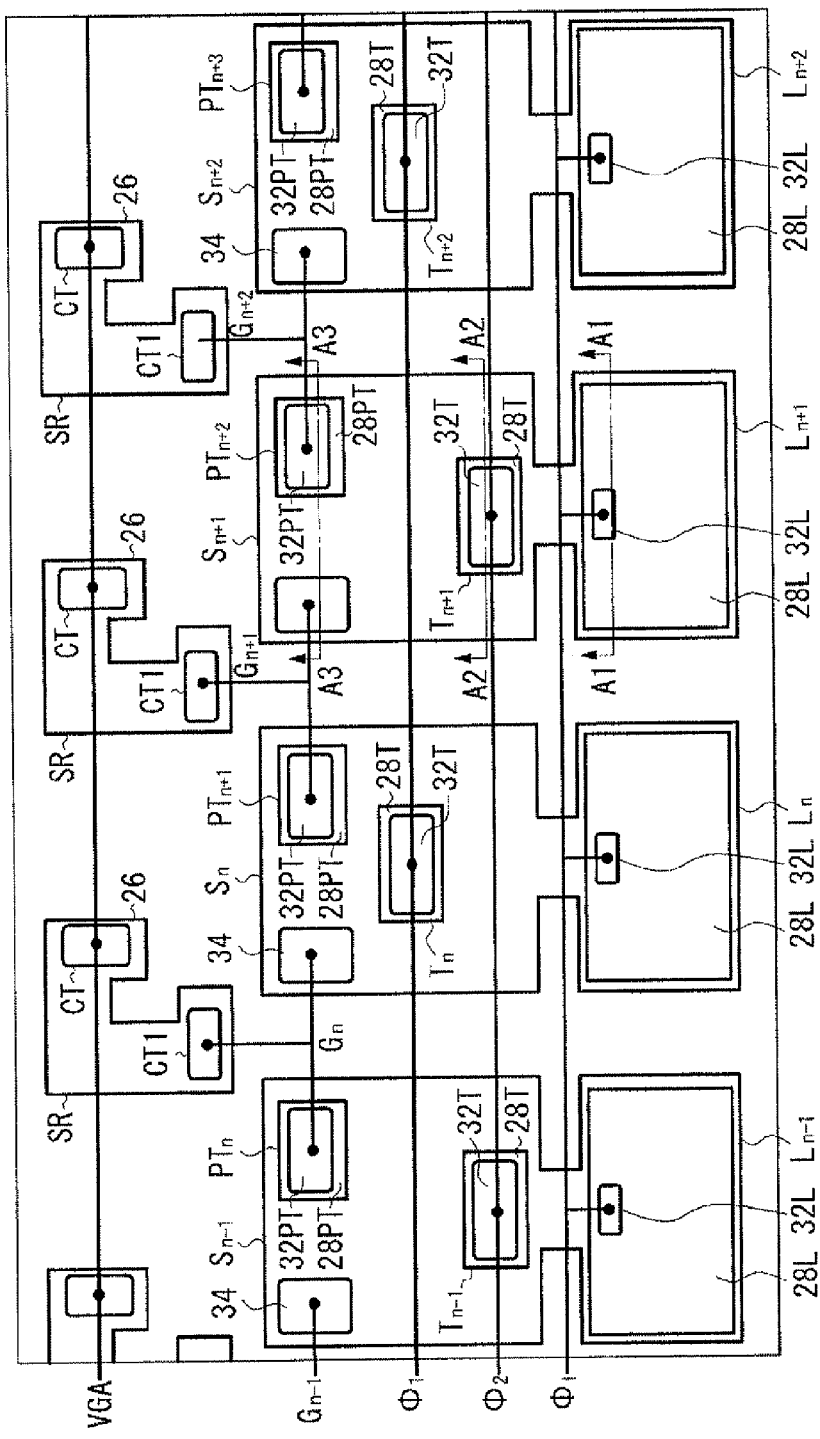
FIG. 1 is a plan view of a self-scanning light-emitting thyristor array according to an example of the present invention.

A light-emitting element array in which a number of light-emitting elements are integrated on the same substrate is combined with a driving circuit thereof and the like and is used in a light source that is used in a print head for an LED printer. In a light-emitting element array in which light-emitting diodes (LEDs) as light-emitting elements are arranged in one dimension, it is necessary to supply a signal corresponding to an image signal from an external driving circuit to the respective LEDs. Thus, it is necessary to form bonding pads for supplying a voltage to the respective LEDs on the substrate in the same numbers as the number of LEDs. However, since bonding pads generally have a large area, an increase in the area of a light-emitting element array chip is inevitable. When the chip size increases, since the number of chips obtainable from one wafer decreases, there is a limit on decreasing the cost.

For example, in a 1200-dpi printer head compatible with A3 paper, the number of LEDs arranged in one dimension is 14,000 or more, and it is necessary to bond wires to the bonding pads in the same numbers as the LEDs. The greater the number of bonding wires, the higher the costs put into manufacturing the light-emitting element array. Further, when high-resolution light-emitting element arrays are manufactured in order to improve the quality of a printed image, the number of bonding pads increases, so that the number of bonding wires increases, the chip size further increases, and the cost increases. In addition to this, there is a limitation in the layout itself of bonding pads on the chip.

In a self-scanning light-emitting element array in which 3-terminal light-emitting thyristors sequentially generate firing pulses, when an anode is prepared in a substrate, a cathode is prepared in the uppermost n-type layer, and a gate is prepared in a p-layer immediately below the cathode layer, an electric current does not flow between the anode and the cathode unless a threshold current flows into the gate. A self-scanning light-emitting device (hereinafter referred to as a SLED) has a configuration in which shift thyristors and light-emitting thyristors are integrated on the same substrate. The shift thyristors are thyristors arranged in an array one-dimensionally having such a property as switching elements. The light-emitting thyristors are thyristors arranged in an array one-dimensionally as light-emitting elements.

In an SLED, it is not necessary to prepare bonding pads corresponding to the respective light-emitting thyristors. When a rectangular voltage is supplied to bonding pads disposed on one side or both sides of a chip, the light-emitting thyristors may generate a firing pulse (perform self-scanning) sequentially starting from the one at the end of the chip. Thus, in the SLED, even when the resolution is increased, it is possible to bond the bonding pads to the end of the chip and to prevent an increase in the number of bonding pads, an increase in the chip size, and an increase in the cost due to an increase in the number of bonding wires.

Hereinafter, exemplary embodiments of the present invention will be described with reference to the drawings. In the present example, a SLED having pnpn-type light-emitting thyristors will be described as an example. A semiconductor layer that forms the pnpn-type light-emitting thyristors is formed of Group III-V compound semiconductors, and in the present example, GaAs, AlGaAs, and AlAs are used as an example of the compound semiconductor. It should be noted that the dimensions of some of the elements may be exaggerated relative to other elements for clarity, and elements shown in the figures have not necessarily been drawn to scale.

EXAMPLES

Figure 2A:
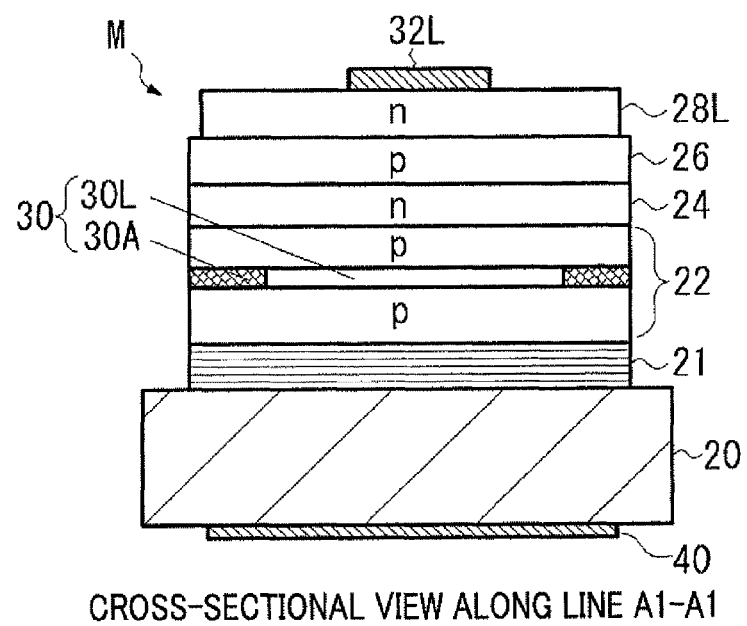
FIGS. 2A to 2C are cross-sectional views taken along line A1-A1, A2-A2, and A3-A3 of FIG. 1.
Figure 2B:
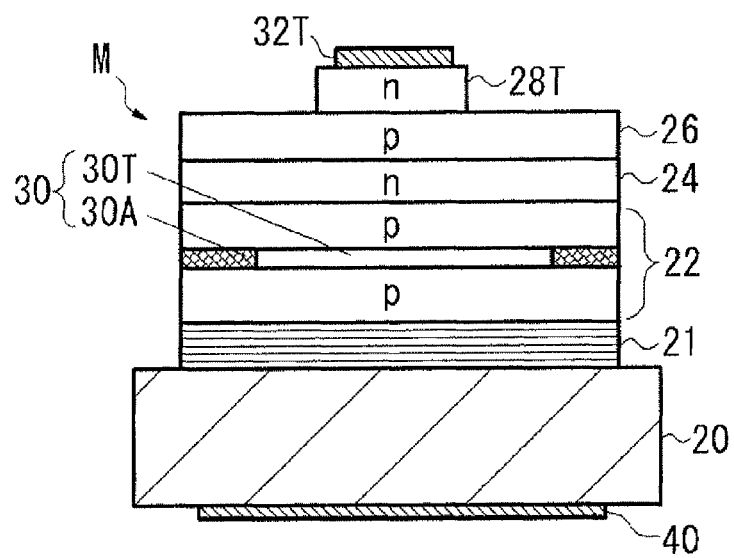
Figure 2C:
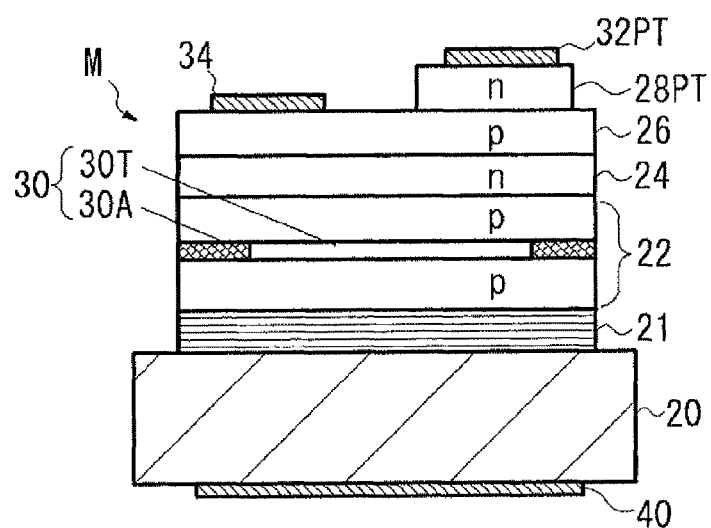
Figure 3A:
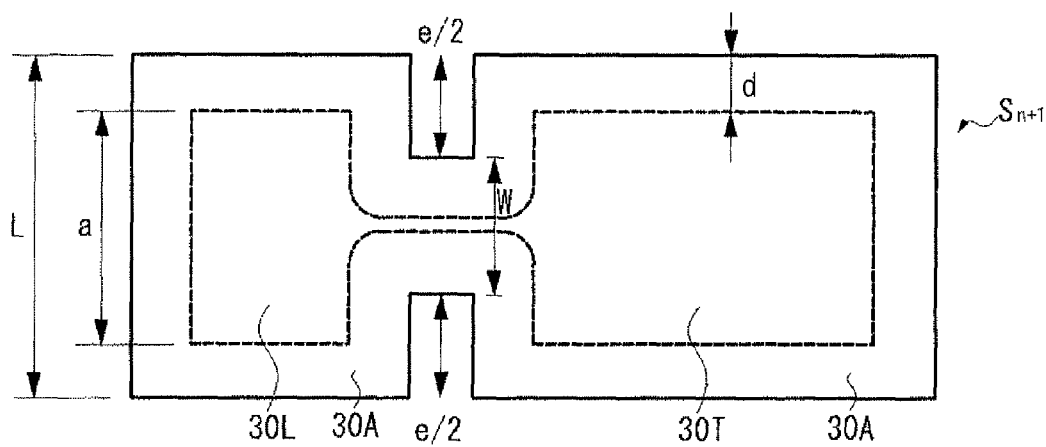
FIG. 3A is a schematic plan view for explaining forming of an oxidized region of an island Sn+1 according to a first example of the present invention.
Figure 3B:
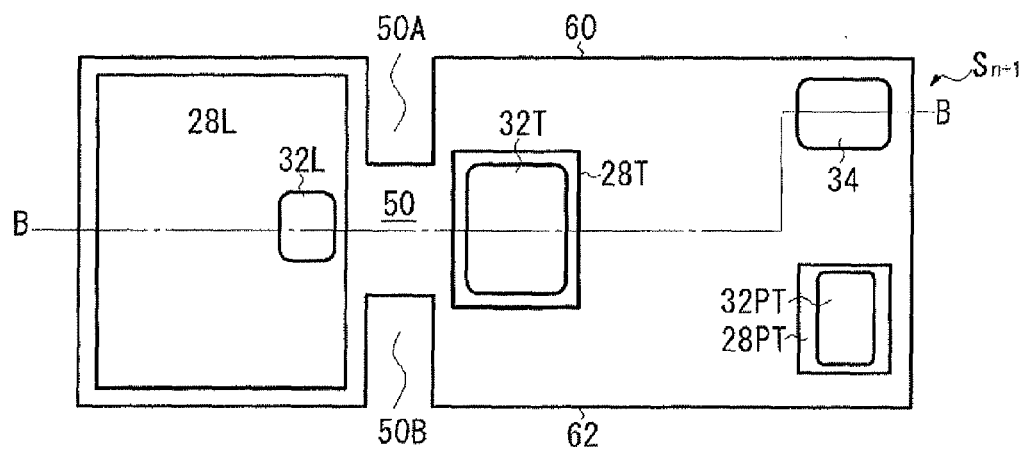
FIG. 3B is a schematic plan view illustrating the configuration of the island Sn+1 according to the first example.
Figure 3C:
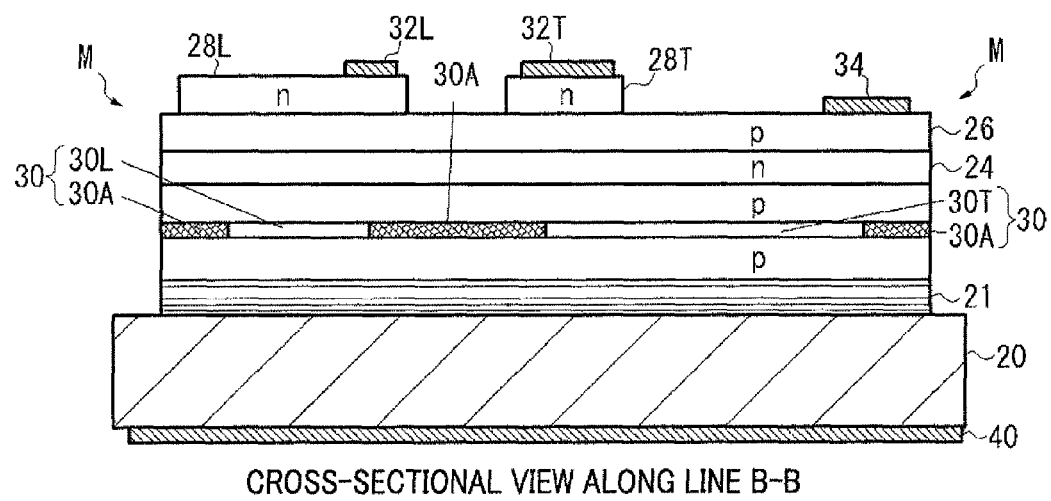
FIG. 3O is a cross-sectional view taken along line B-B of FIG. 3B.
Figure 4:
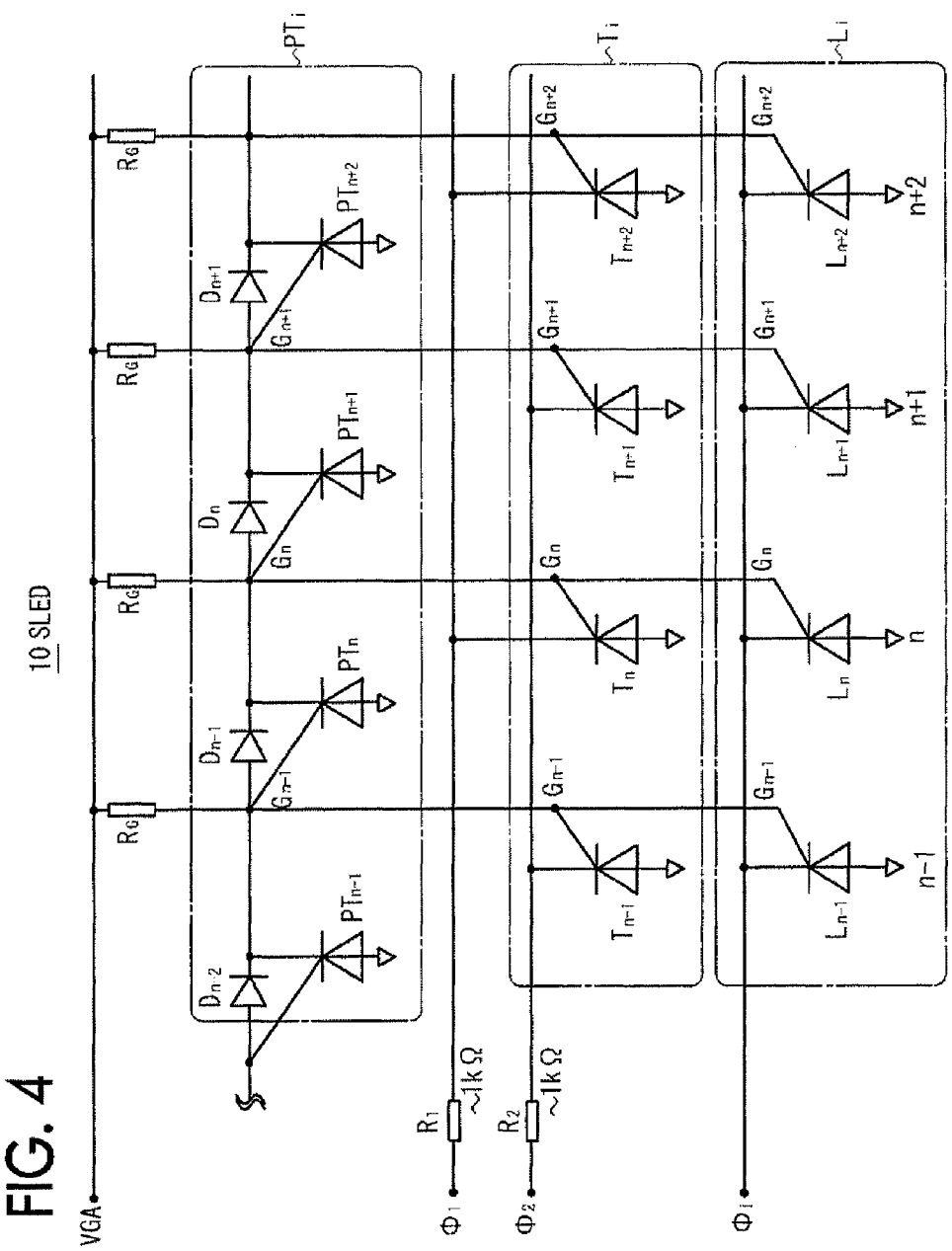
FIG. 4 is an equivalent circuit of a self-scanning light-emitting thyristor array according to the first example of the present invention.

FIG. 1 is a plan view of a part of a SLED according to an example of the present invention, FIGS. 2A to 2C are cross-sectional views taken along lines A1-A1, A2-A2, and A3-A3, of one island of the SLED illustrated in FIG. 1, FIG. 3A is a plan view for explaining forming of an oxidized region of an island Sn+1, FIG. 3B is a schematic plan view of the island Sn+1, and FIG. 3C is a cross-sectional view taken along line B-B of FIG. 3B, FIG. 4 is an equivalent circuit of the SLED illustrated in FIG. 1.

Referring to FIG. 4, the equivalent circuit of four light-emitting elements is illustrated as a part of an SLED 10. In the equivalent circuit, Ln−1, Ln, Ln+1, and Ln+2 are light-emitting thyristors, Tn−1, Tn, Tn+1, and Tn+2 are shift thyristors, Gn−1, Gn, Gn+1, and Gn+2 are the common gates of the light-emitting thyristors and the shift thyristors, $R_G$ is a gate load resistor, Dn−2, Dn−1, Dn, and Dn+1 are coupling diodes, PTn−1, PTn, PTn+1, and PTn+2 are parasitic thyristors formed immediately below the cathode electrodes of the coupling diodes, φ1 is an odd-bit transfer line, φ2 is an even-bit transfer line, φI is an emission signal line, and VGA is a gate line. Here, n is a positive integer. In the following description, the light-emitting thyristors, the shift thyristors, and the parasitic thyristors are collectively referred to as a light-emitting thyristor Li, a shift thyristor Ti, and a parasitic thyristor PTi, respectively.

A transfer function of the SLED will be described. Now, it is assumed that the shift thyristor Tn is in the ON state. In this case, the potential of the gate Gn of the shift thyristor Tn increases up to about −0.2 V, and a potential difference of about 1.5 V corresponding to a diffusion potential occurs between both ends of the coupling diode Dn. Thus, Gn+1=Gn−1.5 V=−1.7 V, and Gn+2=Gn+1−1.5 V=−3.2 V.

Figure 5:
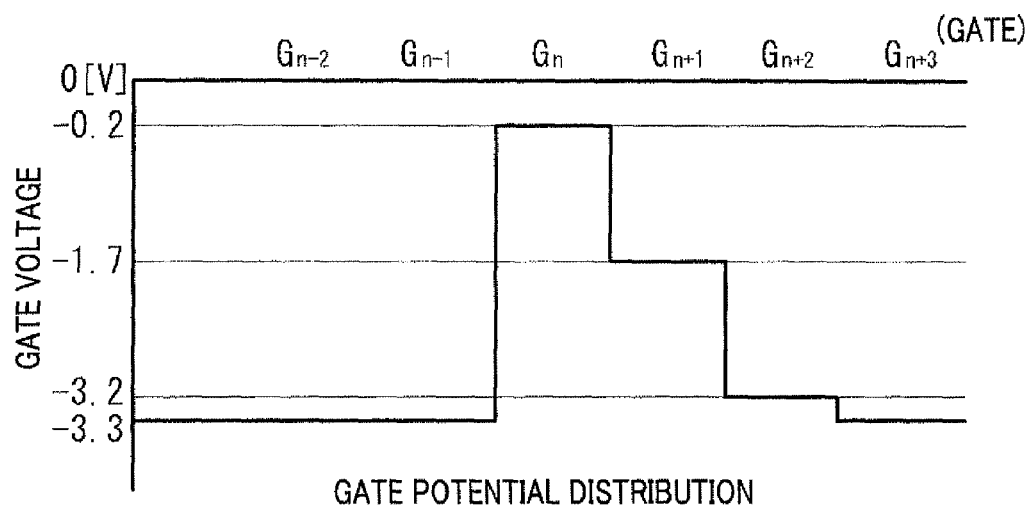
FIG. 5 is a diagram illustrating a gate potential distribution when a shift thyristor Tn generates a firing pulse.
Figure 6:
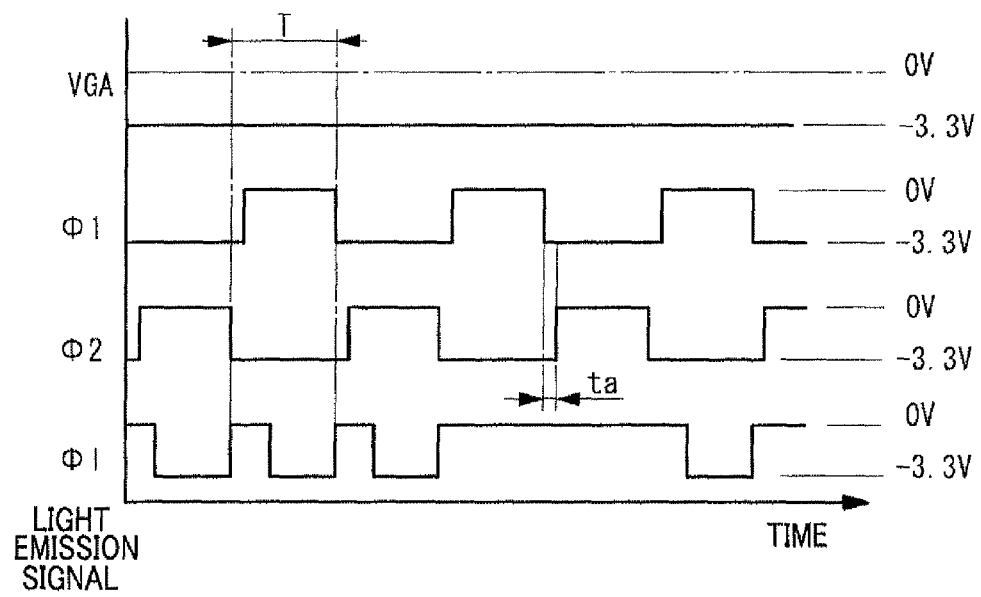
FIG. 6 is a diagram illustrating voltage waveforms of signals applied from the outside.

FIG. 5 illustrates a potential distribution when the shift thyristor Tn generates a firing pulse. Moreover, FIG. 6 illustrates a voltage waveform of the gate line VGA supplied to the gate and a rectangular voltage having a cycle of T supplied to the odd-bit transfer line φ1, the even-bit transfer line φ2, and the emission signal line φI. A period where both the odd-bit transfer line φ1 and the even-bit transfer line φ2 are in the low level is referred to as an overlapping period, which is denoted as "ta".

When the voltage of the gate line VGA and the voltage supplied to the transfer lines φ1, φ2, and φI are set to −3.3 V, a voltage of about 0.1 V is applied between the gate and the cathode of the shift thyristor Tn+2. In order to turn on a thyristor, it is necessary to apply a voltage of a diffusion potential or higher at least between the gate and the cathode and allow an electric current of a holding current or higher to flow between the cathode and the anode. Thus, the shift thyristor Tn+2 cannot generate a firing pulse. On the other hand, since a reverse bias is applied to the diode Dn−1 on the left side of the gate Gn, the potential of the gate Gn−1 amounts to about the voltage (about −3.3 V) of the gate line VGA, and the shift thyristor Tn−1 cannot be turned on. In this way, when the voltage of the odd-bit transfer line φ1 is −3.3 V, and the shift thyristor Tn is turned on, if the even-bit transfer line φ2 is decreased from 0 V to −3.3 V, only the neighboring shift thyristor Tn+1 generates a firing pulse. After that, when the voltage of the odd-bit transfer line φ1 is increased to 0 V, the shift thyristor Tn is turned off, and the ON state may be transferred from the shift thyristor Tn to the shift thyristor Tn+1.

When the shift thyristor Tn is in the ON state, the gate potential Gn is raised to the highest voltage. Thus, when the odd-bit transfer line φ1 is decreased from 0 V to −3.3 V, only the light-emitting thyristor Ln is turned on and lit. In this way, the firing state is sequentially transferred from the left side of the column of shift thyristors to the right side. Only the light-emitting thyristors corresponding to a bit in which the shift thyristors are in the ON state are selectively turned on depending on the data 0 or 1 input to the emission signal line φI from the outside. In this way, the data 0 or 1 is converted into emission or non-emission information.

FIG. 1 illustrates a plan view of an element array corresponding to the 4-bit element illustrated in FIG. 4. A SLED is configured to include a p-type GaAs semiconductor substrate and a pnpn-type semiconductor layer that is epitaxially grown on the semiconductor substrate so that lattice matching is realized. The semiconductor layer is etched, so that islands, namely mesa structures corresponding to the respective elements are formed on the semiconductor substrate. In FIG. 1, four islands Sn−1, Sn, Sn+1, and Sn+2 are formed in correspondence to the circuit of FIG. 4 and are arranged in linear form. In one island, the light-emitting thyristor Li, the shift thyristor Ti, and the coupling diode Di are formed. Moreover, since a pn-layer is present immediately below the coupling diode Di, the parasitic thyristor PTi is formed therein.

The odd-bit transfer line φ1 is connected to cathode electrodes 32T of the shift thyristors of odd-bit islands Sn and Sn+2, and the even-bit transfer line φ2 is connected to cathode electrodes 32T of the shift thyristors of even-bit islands Sn−1 and Sn+1. The emission signal line φI is connected to a cathode electrode 32L of the light-emitting thyristor. Moreover, an island SR connected to the gate line VGA is formed on the substrate. The gate line VGA is electrically connected to a p-type gate layer 26 of the island SR via a contact electrode CT, and the gate load resistor $R_G$ is formed using the p-type gate layer 26. An output terminal of the gate load resistor $R_G$ is connected to the common gate electrode 34 via the contact electrode CT1 and is connected to a cathode electrode 32PT of the adjacent coupling diode.

FIGS. 2A to 2C and FIGS. 3A to 3C illustrate the cross-sections of the light-emitting thyristor Ln+1, the shift thyristor Tn+1, the coupling diode Dn+1, and the parasitic thyristor PTn+2 formed on a representative island Sn+1. A distributed Bragg reflector (DBR) 21 in which multiple pairs of p-type AlGaAs layers with different Al contents are stacked, an anode layer 22 formed of p-type AlGaAs having a predetermined thickness and a predetermined impurity concentration, an n-type gate layer 24 formed of n-type AlGaAs having a predetermined thickness and a predetermined impurity concentration, a p-type gate layer 26 formed of p-type AlGaAs having a predetermined thickness and a predetermined impurity concentration, and cathode layers 28L, 28T, and 28PT formed of n-type GaAs or AlGaAs having a predetermined thickness and a predetermined impurity concentration are formed on a p-type GaAs substrate 20. Moreover, cathode electrodes 32L, 32T, and 322T are formed on and electrically connected to the respective cathode layers 28L, 28T, and 282T, and a common anode electrode 40 that supplies a ground potential is formed on the rear surface of the substrate 20.

A current confining layer 30 formed of p-type AlAs (or p-type AlGaAs having an Al content ratio of 98% or higher, for example) is inserted in a part of the anode layer 22. Preferably, in the anode layer 22, the current confining layer 30 is sandwiched by AlGaAs layers having a relatively small Al content. Further, the Al content in the AlAs (or AlGaAs) constituting the current confining layer 30 is remarkably greater than the Al content in the other semiconductor layers 24, 26, and 28L.

The uppermost n-type cathode layer is processed into a rectangular pattern by a photolithography process, whereby the cathode layers 28L, 28T, and 28PT of the light-emitting thyristor Ln+1, the shift thyristor Tn+1, and the coupling diode Dn+1 are formed. Preferably, the cathode electrode 32L is formed in a relatively small area in relation to the cathode layer 28L, and light emitted from the light-emitting thyristor Ln+1 is not greatly blocked by the cathode electrode 32L. Moreover, since a greater part of the cathode layer 28T of the shift thyristor Tn+1 is covered by the cathode electrode 32T, light is not emitted from the surface of the cathode layer 28T. As illustrated in FIGS. 3A to 3C, a gate electrode 34 is formed on the p-type gate layer 26 that is exposed by patterning the cathode layers 28L, 28T, and 28PT. The gate electrode 34 is shared between the light-emitting thyristor Ln+1 and the shift thyristor Tn+1 and is also shared with the anode electrode of the coupling diode.

The approximately rectangular island Sn+1 is formed by etching the semiconductor layer stacked on the substrate. Although the island Sn+1 is processed into a mesa structure M having a side surface having a depth such that the side surface reaches at least the current confining layer 30, in the example illustrated in the drawings, the mesa structure M has a side surface having a depth such that the side surface reaches the substrate 20. In the first example, as illustrated in FIGS. 3A to 3C, the island Sn+1 includes a pair of rectangular groove portions 50A and 50B or depressed portions which are formed between a formation region of the light-emitting thyristor and a formation region of the shift thyristor so as to extend by a length of e/2 toward the inner side from the opposing side surfaces 60 and 62. Preferably, the groove portions 50A and 50B are formed by etching simultaneous with forming of the island Sn+1 and have the same depth as the side surface of the mesa structure M. The pair of groove portions 50A and 50B form a constricted portion 50 of which the width W is decreased, and which is formed between a formation region of the light-emitting thyristor and a formation region of the shift thyristor.

As illustrated in FIGS. 3A and 3B, the left side of the pair of groove portions 50A and 50B is the formation region of the light-emitting thyristor, and the rectangular cathode layer 28L and the cathode electrode 32L are formed on the surface of the formation region. The right side of the pair of groove portions 50A and 50B is the formation region of the shift thyristor, and the rectangular cathode layer 28T and the cathode electrode 32T are sequentially formed on the formation region. Further, the cathode layer 28PT and the cathode electrode 32PT for the coupling diode and the common gate electrode 34 are formed to be adjacent to the formation region of the shift thyristor.

When the island Sn+1 is oxidized, since the current confining layer 30 is oxidized from the side surface of the island Sn+1 by an oxidation length d, an oxidized region 30A having a shape resembling the outer shape of the island Sn+1 is formed in the current confining layer 30 as illustrated in FIG. 3A. In this way, an approximately rectangular non-oxidized region (conductive region) 30L surrounded by the oxidized region 30A is formed in the formation region of the light-emitting thyristor, and an approximately rectangular non-oxidized region (conductive region) 30T surrounded by the oxidized region 30A is formed in the formation region of the shift thyristor.

In the light-emitting thyristor, in order to confine carriers in the conductive region 30L at the center of the light-emitting thyristor, it is preferable to oxidize the entire surface of the current confining layer 30 of the constricted portion 50 so that the conductive region 30L is completely surrounded by the oxidized region 30A. Thus, the oxidation length d needs to be equal to or larger than half of the width W of the constricted portion 50 remaining due to the groove portions 50A and 50B. However, it is known that the width a of the conductive region 30L decreases if the oxidation length d is increased, and the light emission quantity of the light-emitting thyristor decreases if the width a is too small. Therefore, it is necessary to decrease the oxidation length d in order to increase the width a of the conductive region 30L as much as possible. Moreover, necessary to decrease the width W further and to increase the etching length e of the groove portions 50A and 50B in order to oxidize the entire surface of the constricted portion 50. However, when the etching length e is large and the width W is small, since the capacitance between the cathode electrode 321, and the gate electrode 34 increases, the threshold voltage of the light-emitting thyristor increases. Thus, it is difficult for the light-emitting thyristor to be turned on.

The above relationship is expressed as the following formula.

When the width of the constricted portion 50 between the groove portions 50A and 50B is W, the etching length of each of the groove portion 50A and 50B is e/2 (e in total), and the width of the mesa structure M of the opposing side surfaces 60 and 62 of the island Sn+1 is L, the following relationship is satisfied.

$$L = e + W \quad (1)$$

Here, when the oxidation length is d and the width of the conductive region 50L is a, the following relationship is satisfied.

$$L = 2d + a \quad (2)$$

From the expressions (1) and (2), the following relationship is satisfied.

$$e + W = 2d + a \quad (3).$$

Since a current confining effect decreases unless the constricted portion 50 is surrounded by the oxidized region 30A, a relationship of 2d≥W needs to be satisfied. From this relationship and the expression (3), the following relationship is satisfied.

$$e+W=2d+a\geq W+a$$

$$\therefore e\geq a$$

When a minimum value of the width a of the conductive region 30L for obtaining a certain light emission quantity or higher is present, and the minimum width is $a_{min}$, the following relationship is satisfied.

$$e\geq a_{min} \quad (4)$$

Thus, the etching length e needs to be equal to or larger than the minimum value $a_{min}$ of the width a of the conductive region 30L.

When a minimum value of the width W of the constricted portion 50 for suppressing the resistance between the cathode and the gate to be a certain value or smaller is present, and the maximum value of the etching length corresponding to the minimum width is $e_{max}$, the following relationship is satisfied.

$$e\leq e_{max} \quad (5)$$

As illustrated in Mathematical formula 1 below, if there is such an etching length e satisfying both of the expressions (4) and (5), it is most preferable to form the groove portions 50A and 50B from both sides of the island Sn+1 and allow the constricted portion 50 to be left. However, if there is no solution to the simultaneous inequalities (4) and (5), the method of forming the groove portions 50A and 50B from both sides of the island Sn+1 is not always the best, and the groove portions may be formed by another method.

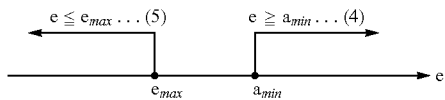

Figure 7A:
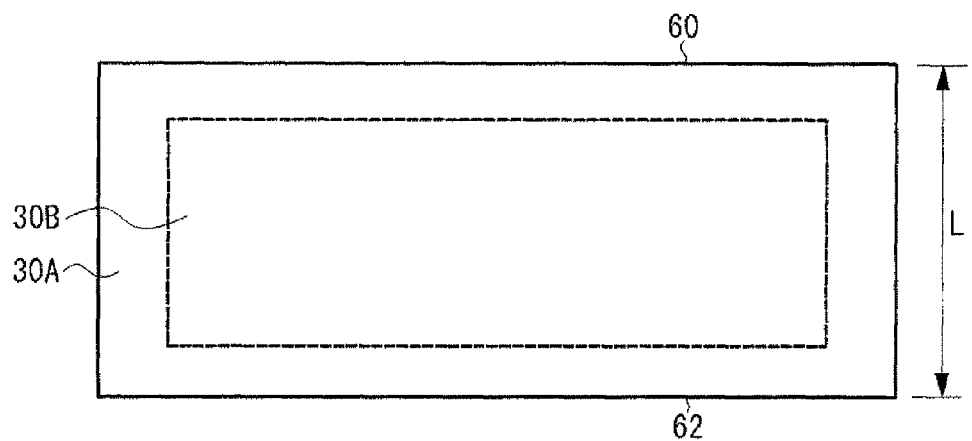
FIG. 7A is a schematic plan view for explaining forming of an oxidized region of an island according to a comparative example.
Figure 7B:
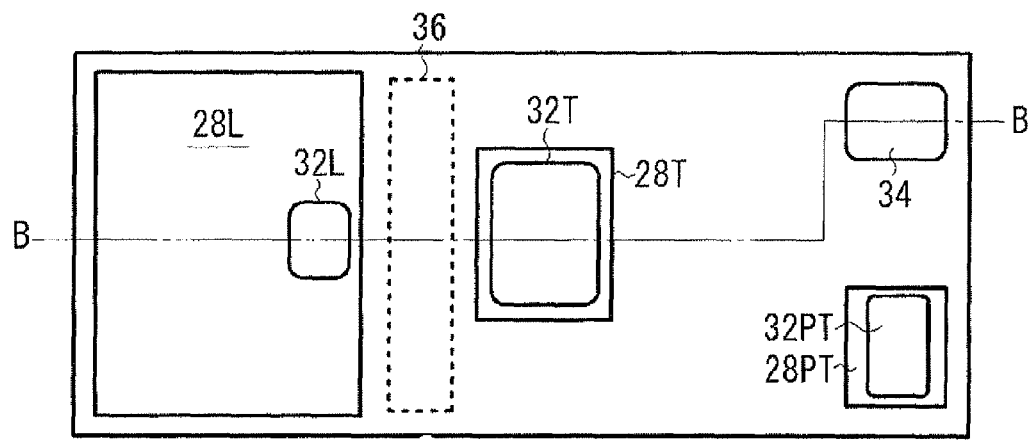
FIG. 7B is a schematic plan view illustrating the configuration of an island according to the comparative example.

Next, the light-emitting element of the present example will be compared with a light-emitting element (comparative example) having an island in which the groove portions 50A and 50B are not formed. The light-emitting element of the comparative example has a configuration in which a pnpn structure of AlGaAs that is epitaxially grown is formed on a p-type GaAs substrate 20, and a current confining layer 30 of AlAs formed in a p-type anode layer 22 is exposed via a mesa surface. As illustrated in FIG. 7A, the island of the comparative example includes side surfaces 60 and 62 having a constant width L, and unlike the present example, the groove portions 50A and 50B are not formed between the formation region of the light-emitting thyristor and the formation region of the shift thyristor. When the current confining layer 30 is oxidized from the side surface of the island by vapor oxidation-annealing, as illustrated in FIG. 7A, an oxidized region 30A having a frame shape resembling the outer shape of the island and a rectangular conductive region 30B surrounded by the oxidized region 30A are formed in the current confining layer 30. The oxidized region 30A is a high resistance region formed of $Al_2O_3$. The current path is narrowed to the non-oxidized AlAs conductive region 30B, whereby non-emission recombination of carriers on the side surface of the island is suppressed. The carriers recombining in an active layer are confined in the central portion of the conductive region 30B, whereby the light emission quantity is increased.

Figure 7C:
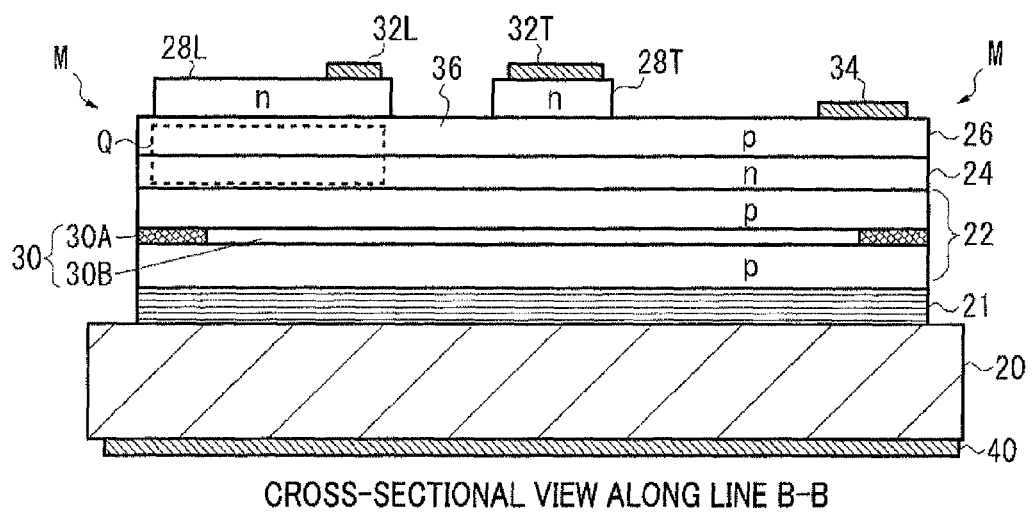
FIG. 7C is a cross-sectional view taken along line B-B of FIG. 1.

In the light-emitting thyristor, as indicated by a broken line Q in FIG. 7C, recombination of carriers occurs in the p-type gate layer 26 and the n-type gate layer 24 below the cathode electrode 32L, and light is emitted. Although the electric current flowing from the anode electrode 40 to the cathode electrode 32L is confined in the conductive region 30B, the current confining effect does not occur on the right side of the island illustrated in the drawing, that is, in the direction toward the shift thyristor. That is, the electric current flows toward the right side, and non-emission recombination occurs in the region 36 on the p-type gate layer 26 and does not contribute to light emission. Thus, even when the oxidized region 30A is formed in the current confining layer 30, there is a limit on increasing the light emission quantity.

In contrast, in the SLED of the present example, the constricted portion 50 is formed between the formation region of the light-emitting thyristor and the formation region of the shift thyristor, and the conductive region 30L of the light-emitting thyristor is surrounded by the oxidized region 30A. Thus, a structure such that it becomes difficult for electrons injected from the cathode electrode 32L to diffuse toward the region 36 is realized. Therefore, current confining is performed efficiently, light emission efficiency is improved, and high output power may be obtained. In the above example, although the pair of groove portions 50A and 50B is formed so as to extend toward the inner side from the opposing side surfaces 60 and 62, one groove portion may be formed so as to extend toward the inner side from any one of the side surfaces.

Figure 8A:
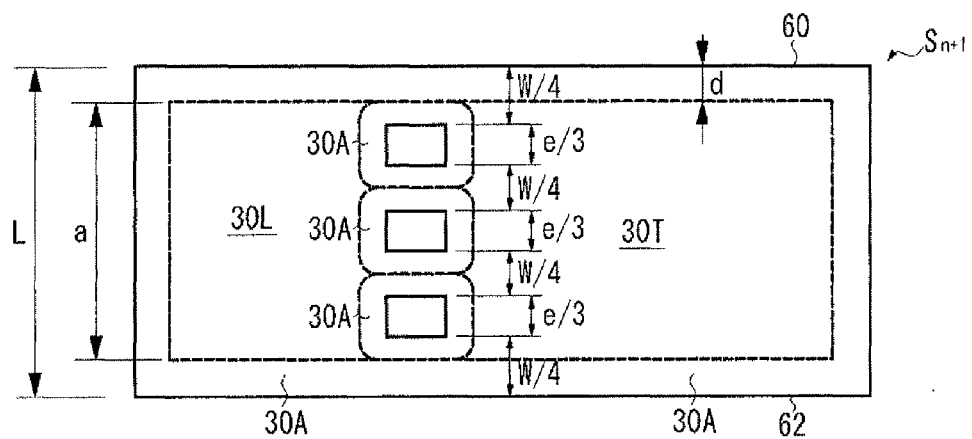
FIG. 8A is a schematic plan view for explaining forming of an oxidized region of an island Sn+1 according to a second example of the present invention.
Figure 8B:
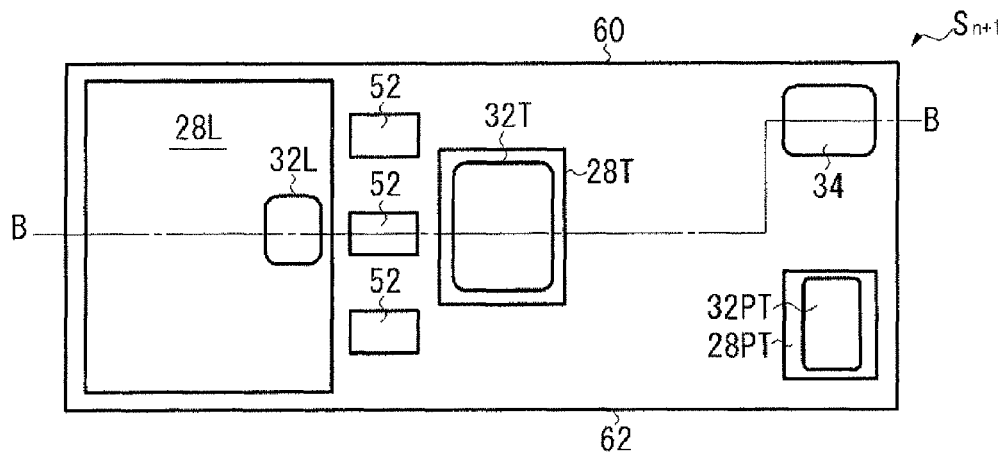
FIG. 8B is a schematic plan view illustrating the configuration of the island Sn+1 according to the second example.
Figure 8C:
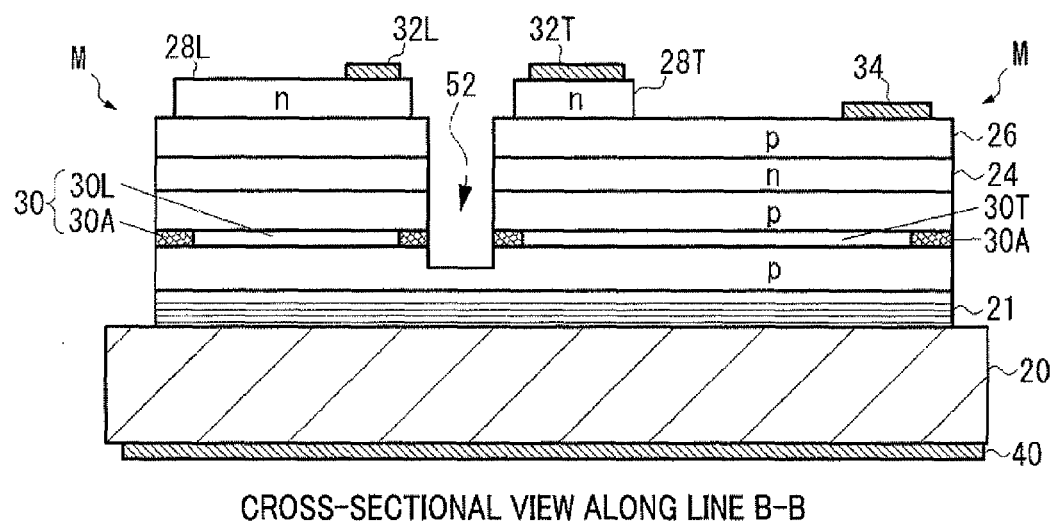
FIG. 8C is a cross-sectional view taken along line B-B of FIG. 8B.

Next, a second example of the present invention will be described. FIGS. 8A to 8C illustrate the configuration of an island used in the SLED of the second example, in which FIG. 8A is a plan view illustrating the forming of an oxidized region of the island, FIG. 8B is a schematic plan view of the island, and FIG. 8C is a cross-sectional view taken along line B-B of FIG. 8B. In the second example, unlike the first example, one or multiple groove portions are formed on the inner side of the opposing side surfaces rather than forming a constricted portion from the opposing side surfaces of the island. In this way, the oxidized region is formed efficiently between the formation region of the light-emitting thyristor and the formation region of the shift thyristor.

As illustrated in FIGS. 8B and 8C, n groove portions 52 having a depth such that the groove portions 52 reach at least the current confining layer 30 are formed between the formation region of the light-emitting thyristor of the island Sn+1 and the formation region of the shift thyristor. In the example of the drawings, n=3, and one groove portion 52 has a rectangular shape. The groove portions 52 may be simultaneously formed by etching when the island Sn+1 is formed and may be formed by etching separately from the forming of the side surfaces of the island Sn+1. Moreover, it is preferable that the distance between the adjacent groove portions 52 is the same as the distance between the groove portions 52 and the side surfaces 60 and 62. When the sum of the respective distances is W, the distance between the groove portions or the distance to the side surface of the mesa structure is W/(n+1).

Similarly to the first example, when the width of the rectangular groove portion 52 is e/n, the following relationships are satisfied.

$$L=e+W \quad (1)$$

$$L=2d+a \quad (2)$$

From the expressions (1) and (2), the following relationship is satisfied.

$$e+W=2d+a \quad (3).$$

Since a current confining effect decreases unless the region between the side surfaces 60 and 62 remaining due to the groove portions 52 is surrounded by the oxidized region, a relationship of $2d \geq W/(n+1)$ needs to be satisfied.

From this relationship and the expression (3), the following relationship is satisfied.

$$e+W=2d+a \geq W/(n+1)+a$$

$$\therefore e \geq a-nW/(n+1)$$

When a minimum value of the width a of the conductive region 30L for obtaining a certain light emission quantity or higher is present, and the minimum width is $a_{min}$, the following relationship is satisfied.

$$e \geq a_{min}-nW/(n+1) \quad (6)$$

Similarly to the first example, when a minimum value of the width W for suppressing the resistance between the cathode and the gate to be a certain value or smaller is present, and the maximum value of the etching length corresponding to the minimum width is $e_{max}$, the following relationship is satisfied.

$$e \leq e_{max} \quad (5)$$

Since the expression (6) sets the minimum value of e to a smaller value as compared to the expression (4), it is easy to take the etching length e satisfying both of the expressions (5) and (6) as illustrated in Mathematical formula 2.

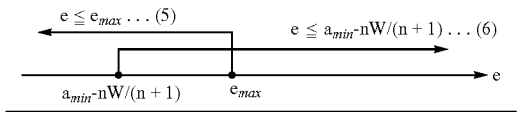

As above, the same constricted portion 50 as the first example may be formed as long as there is no problem in the increase of the threshold voltage due to the increase of the resistance value between the cathode and the gate. If there is a problem in the increase of the threshold voltage, when the constricted portion 50 is formed, at least one groove portion 52 which becomes a depressed region isolated in the inner side of the side surfaces 60 and 62 may be formed between the formation region of the light-emitting thyristor and the formation region of the shift thyristor. In this way, it is possible to increase the aperture diameter a of the conductive region 30L while maintaining the resistance between the cathode and the gate to be low. Further, it is possible to realize a structure in which the outer periphery of the conductive region 30L is completely surrounded by the oxidized region 30A.

Figure 9A:
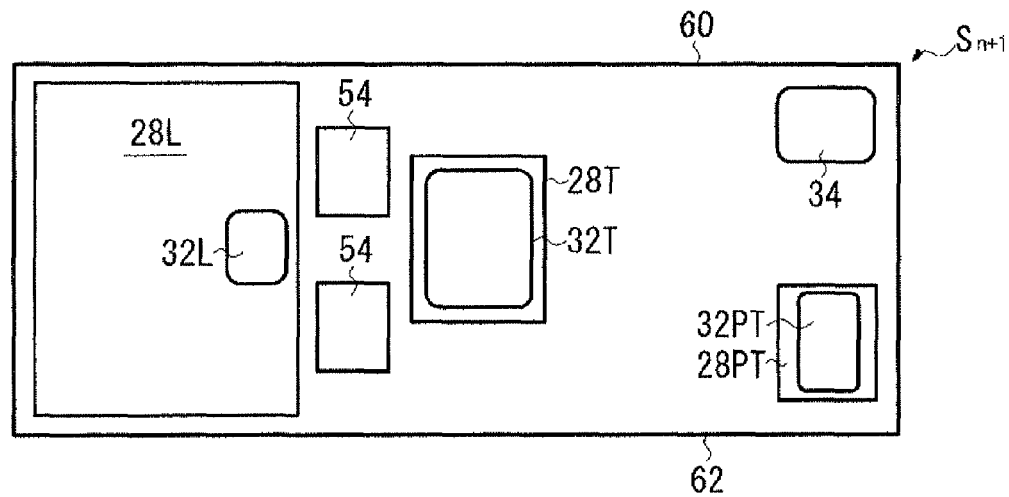
FIGS. 9A and 9B are schematic plan views illustrating another configuration example of an island according to the second example of the present invention.
Figure 9B:
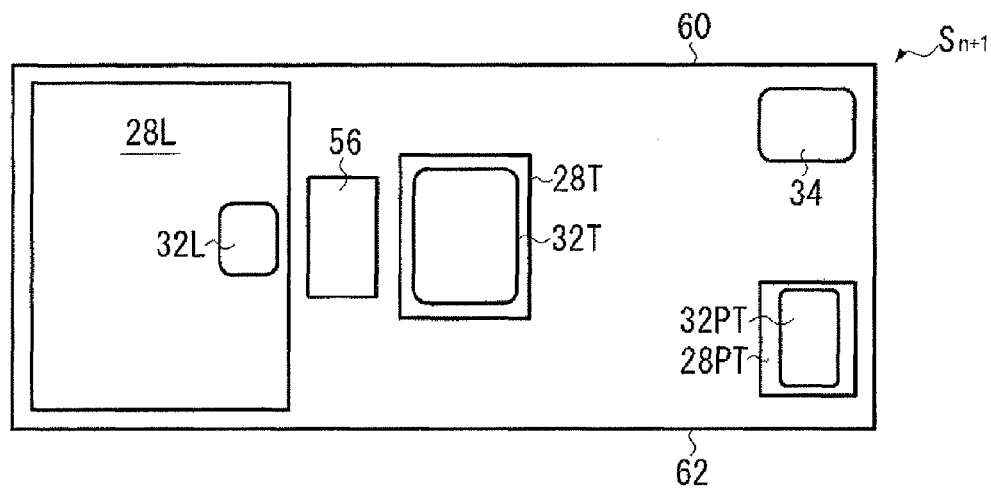

FIGS. 9A and 9B illustrate another example of the groove portion as a depressed region that is formed in the inner side of the opposing side surfaces 60 and 62 of the island Sn+1. In the island illustrated in FIG. 9A, two rectangular groove portions 54 are formed. Preferably, the two groove portions 54 are formed at an equal distance from the side surfaces 60 and 62. More preferably, the distance from the side surface is the same as the distance between the groove portions 54. In the island illustrated in FIG. 9B, one rectangular groove portion 56 is formed approximately at the center. Preferably, the groove portion 56 is formed to be bilaterally symmetrical with respect to the central line in the longitudinal direction of the island Sn+1. In other words, the groove portion 56 is formed to be at the same distance from the side surfaces 60 and 62. The groove portion desirably has an oblong shape and may have another shape such as a polygonal shape, a circular shape, or an elliptical shape. Further, the groove portions (depressed regions) are desirably at the equal intervals, but may not necessarily be at equal intervals if the interval between adjacent depressed regions is less than twice the oxidation length d.

In the above exemplary embodiment, although the current confining layer 30 is formed in the anode layer 22, the current confining layer 30 may be formed at another position. For example, the current confining layer 30 may be formed at the boundary between the n-type gate layer 24 and the anode layer 22. Further, in the present example, although the island has a rectangular shape in a plan view thereof, this is only an example, and the island may have other shapes, for example, a circular shape, an elliptical shape, a trapezoidal shape, and other polygonal shapes.

Figure 10:
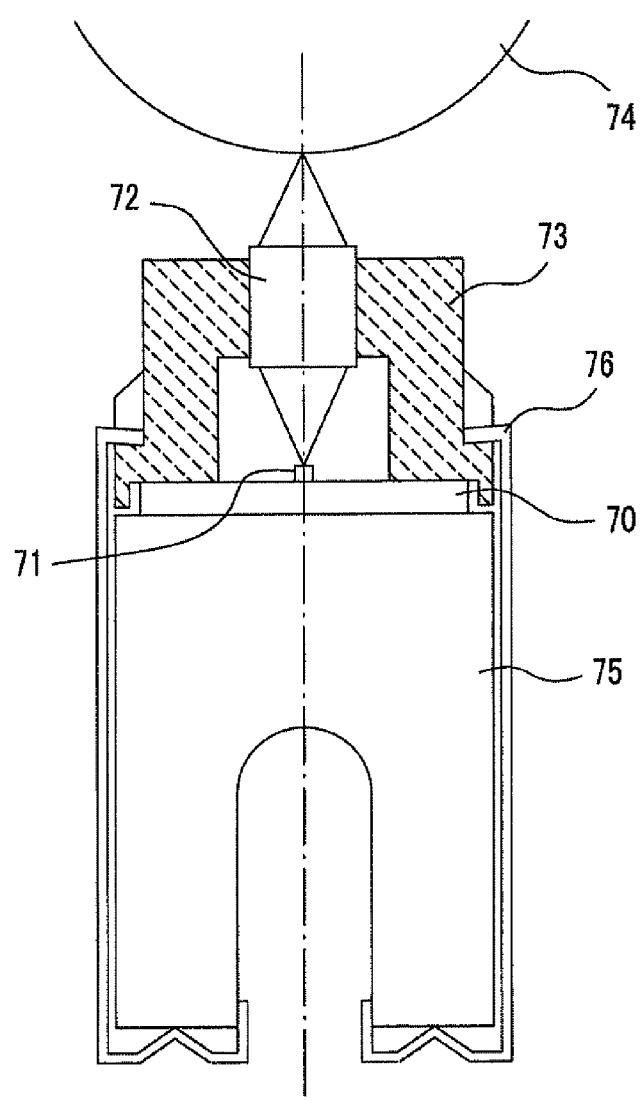
FIG. 10 is a diagram illustrating an example of the structure of an optical writing head to which the self-scanning light-emitting element array according to the present example is applied.

The self-scanning light-emitting element array described above is used in an optical writing head of an optical printer, for example. FIG. 10 illustrates an example of an optical writing head using a self-scanning light-emitting element array. Multiple light-emitting element array chips 71 on which light-emitting thyristors are disposed in an array form are mounted on a chip-mounting substrate 70 in a main scanning direction. A rod lens array 72 of an erecting same magnification system, extending in the main scanning direction is fixed to the optical path of light emitted by the light-emitting elements of the light-emitting element array chip 71 by a resin housing 73. A photosensitive drum 74 is formed on the optical axis of the rod lens array 72. Moreover, a heat sink 75 for discharging the heat of the light-emitting element array chip 71 is formed on the base of the chip-mounting substrate 70, and the housing 73 and the heat sink 75 are fixed by a clamping bracket 76 with the chip-mounting substrate 70 interposed.

Figure 11:
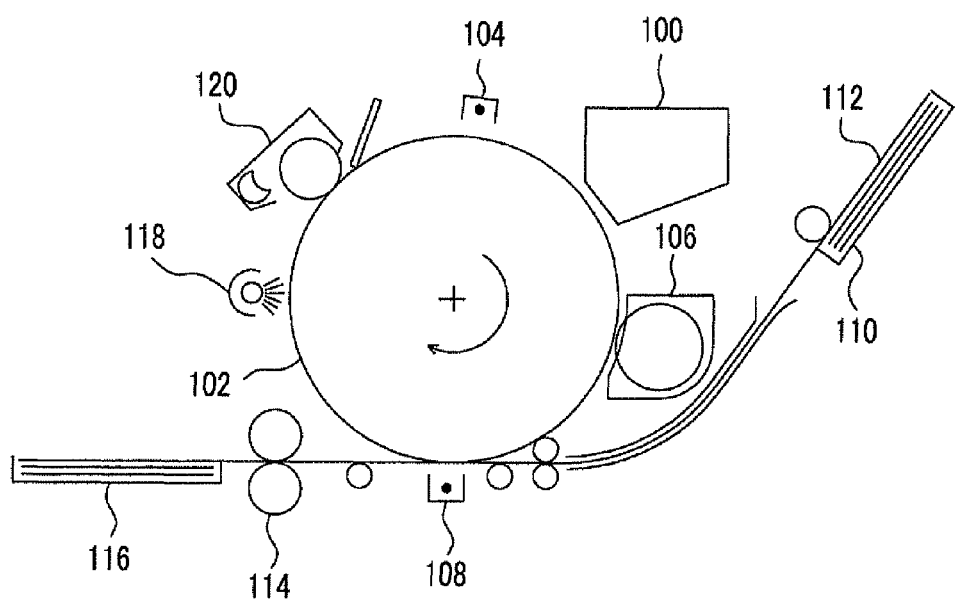
FIG. 11 is a diagram illustrating an application example in which an optical writing head using the self-scanning light-emitting element array according to the present example is applied to an optical printer.

FIG. 11 illustrates an optical printer that uses the optical writing head illustrated in FIG. 10. An optical writing head 100 is provided in the optical printer. A light-conductive material (photosensitive material) such as amorphous Si is formed on the surface of a cylindrical photosensitive drum 102. This photosensitive drum 102 rotates at printing speed. The surface of the rotating photosensitive drum 102 is uniformly charged by a charging device 104. Moreover, the optical writing head 100 irradiates the photosensitive material with the light corresponding to the dot images to be printed, and the charged portions of the photosensitive material are neutralized by the irradiated light, whereby a latent image is formed. Subsequently, a developing device 106 causes toner to be attached to the photosensitive material depending on the state of the charge on the photosensitive material. Then, a transfer device 108 transfers the toner to a sheet 112 transported from a cassette 110. The sheet 112 is heated and fixed by a fixing device 114 and is then conveyed to a stacker 116. After the transfer process ends, the entire surface of the charged photosensitive drum is neutralized by an erasing lamp 118, and the remaining toner on the photosensitive drum is removed by a cleaning device 120. Such an optical writing head may be used in an image forming apparatus such as a facsimile or a copier as well as the printer.

While preferred exemplary embodiments of the present invention have been described, the present invention is not limited to a specific exemplary embodiment, and various modifications and changes are possible within the scope of the invention described in the claims.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting element comprising:
a semiconductor substrate;
an island structure formed on the semiconductor substrate and including at least a current confining layer and p-type and n-type semiconductor layers;
a light-emitting thyristor formed in the island structure and comprising a pnpn structure; and
a shift thyristor formed in the island structure and comprising a pnpn structure, wherein
the island structure defines n groove portions that are completely surrounded by side surfaces of the island structure so that each groove portion of the n groove portions correspond to holes defined in the island structure, wherein each groove portion of the n groove portions comprises a depth that reaches at least the current confining layer and each groove portion of the n groove portions is formed between a formation region of the shift thyristor of the island structure and a formation region of the light-emitting thyristor, and
an oxidized region that is selectively oxidized from a side surface of the island structure and a side surface of the groove portion is formed in the current confining layer.

2. The light-emitting element according to claim 1, wherein
the groove portion extends toward a side from opposing side surfaces of the island structure.

3. The light-emitting element according to claim 1, wherein
the n groove portions are disposed at equal intervals.

4. The light-emitting element according to claim 1, wherein
the groove portion extends toward the inner side from any one of opposing side surfaces of the island structure.

5. The light-emitting element according to claim 1, wherein
a non-oxidized region which is surrounded by an oxidized region that is oxidized from the side surface of the island structure and the side surface of the groove portion is formed in the current confining layer in the formation region of the light-emitting thyristor.

6. The light-emitting element according to claim 2, wherein
a non-oxidized region which is surrounded by an oxidized region that is oxidized from the side surface of the island structure and the side surface of the groove portion is formed in the current confining layer in the formation region of the light-emitting thyristor.

7. The light-emitting element according to claim 3, wherein
a non-oxidized region which is surrounded by an oxidized region that is oxidized from the side surface of the island structure and the side surface of the groove portion is formed in the current confining layer in the formation region of the light-emitting thyristor.

8. The light-emitting element according to claim 4, wherein
a non-oxidized region which is surrounded by an oxidized region that is oxidized from the side surface of the island structure and the side surface of the groove portion is formed in the current confining layer in the formation region of the light-emitting thyristor.

9. The light-emitting element according to claim 1, further comprising:
a gate electrode shared with the light-emitting thyristor and formed in the formation region of the shift thyristor of the island structure.

10. The light-emitting element according to claim 2, further comprising:
a gate electrode shared with the light-emitting thyristor and formed in the formation region of the shift thyristor of the island structure.

11. The light-emitting element according to claim 3, further comprising:
a gate electrode shared with the light-emitting thyristor and formed in the formation region of the shift thyristor of the island structure.

12. The light-emitting element according to claim 4, further comprising:
a gate electrode shared with the light-emitting thyristor and formed in the formation region of the shift thyristor of the island structure.

13. The light-emitting element according to claim 9, further comprising:
a diode formed in the island structure in a region of a pn layer separated from the light-emitting thyristor and the shift thyristor, wherein
an anode layer of the diode is shared with the gates of the light-emitting thyristor and the shift thyristor.

14. The light-emitting element according to claim 1, further comprising:
a semiconductor multilayer reflecting mirror disposed between the pnpn structure of the light-emitting thyristor and the semiconductor substrate.

15. A self-scanning light-emitting element array comprising:
a plurality of the light-emitting elements according to claim 1, wherein
a first transfer signal is applied to a cathode layer of the shift thyristor of each of odd-numbered island structures,
a second transfer signal different from the first transfer signal is applied to a cathode layer of the shift thyristor of each of even-numbered island structures, and
the gates of the shift thyristors of the adjacent island structures are electrically connected by the diode.

16. An optical writing head using the light-emitting element array according to claim 15.

17. An image forming apparatus comprising:
the optical writing head according to claim 16.

* * * * *